United States Patent
Kub et al.

(10) Patent No.: US 8,384,129 B2
(45) Date of Patent: Feb. 26, 2013

(54) TRANSISTOR WITH ENHANCED CHANNEL CHARGE INDUCING MATERIAL LAYER AND THRESHOLD VOLTAGE CONTROL

(75) Inventors: Francis J. Kub, Arnold, MD (US); Karl D. Hobart, Upper Marlboro, MD (US); Charles R. Eddy, Jr., Columbia, MD (US); Michael A Mastro, Fairfax, VA (US); Travis Anderson, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 112 days.

(21) Appl. No.: 12/823,210

(22) Filed: Jun. 25, 2010

(65) Prior Publication Data

US 2010/0327322 A1 Dec. 30, 2010

Related U.S. Application Data

(60) Provisional application No. 61/220,272, filed on Jun. 25, 2009.

(51) Int. Cl.
*H01L 29/778* (2006.01)

(52) U.S. Cl. ......... 257/194; 257/E29.246; 257/E29.252; 257/E29.253

(58) Field of Classification Search .................. 257/194, 257/E29.246, E29.252, E29.253
See application file for complete search history.

(56) References Cited

U.S. PATENT DOCUMENTS

| | | | |
|---|---|---|---|
| 2006/0180831 A1* | 8/2006 | Nakazawa et al. | 257/189 |
| 2008/0093626 A1* | 4/2008 | Kuraguchi | 257/190 |
| 2010/0102358 A1* | 4/2010 | Lanzieri et al. | 257/194 |
| 2010/0270559 A1* | 10/2010 | Ota | 257/76 |
| 2010/0270591 A1* | 10/2010 | Ahn | 257/194 |
| 2010/0301395 A1* | 12/2010 | Xu et al. | 257/194 |
| 2011/0223746 A1* | 9/2011 | Briere | 438/479 |
| 2011/0263102 A1* | 10/2011 | Heikman et al. | 438/478 |

* cited by examiner

*Primary Examiner* — Victor A Mandala
(74) *Attorney, Agent, or Firm* — Amy Ressing; Rebecca L. Forman

(57) ABSTRACT

High electron mobility transistors and fabrication processes are presented in which a barrier material layer of uniform thickness is provided for threshold voltage control under an enhanced channel charge inducing material layer (ECCIML) in source and drain regions with the ECCIML layer removed in the gate region.

25 Claims, 7 Drawing Sheets

TRANSISTOR WITH ENHANCED CHANNEL CHARGE INDUCING MATERIAL LAYER AND THRESHOLD VOLTAGE CONTROL

REFERENCE TO RELATED APPLICATION

This application claims priority to and the benefit of U.S. Provisional Patent Application Ser. No. 61/220,272, filed Jun. 25, 2009, entitled "Transistor with Enhanced Channel Charge Inducing Material Layer and Threshold Voltage Control", the entirety of which is hereby incorporated by reference.

FIELD OF THE DISCLOSURE

The present disclosure relates generally to semiconductor devices and fabrication methods therefor, and in particular to high electron mobility transistors with a barrier material layer of uniform thickness for threshold voltage control beneath an enhanced channel charge inducing material layer in source and drain access regions with the enhanced channel charge inducing material layer removed in the gate region.

BACKGROUND

Wide-bandgap High Electron Mobility Transistors (HEMTs) offer thermal and chemical stability, as well as high mobility and breakdown field, but the standard HEMT is a depletion mode device and enhancement mode (normally-off) devices are desirable for enhancement mode transistor of enhancement mode/depletion mode logic circuits mixed-signal (analog/digital), and high power switching applications to reduce power consumption and simplify circuit design and safety. In addition, recessed gate device structures with well controlled barrier material layer thickness are desired for depletion mode microwave devices to reduce the source and drain access resistance. Shifting the threshold voltage to create an enhancement mode device has been attempted by etching AlGaN barrier material layer to be sufficiently thin to reduce the polarization induced two dimensional electron gas channel charge or by implanting negative charge in the AlGaN barrier material layer under the gate by exposing the device to a fluorine-based plasma, but plasma exposure in these approaches risks damage and thus requires complicated post-processing anneal operations. In addition, the process of etching the AlGaN barrier material layer to be sufficiently thin to achieve enhancement mode (normally-off) operation results in a low polarization induced channel charge in the source and drain regions and thus high source and drain access resistance. Accordingly, there is a need for improved normally-off (enhancement mode) high electron mobility transistors and recessed gate depletion mode microwave transistors and techniques for fabricating such transistors.

SUMMARY OF DISCLOSURE

Various details of the present disclosure are hereinafter summarized to facilitate a basic understanding, where this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter.

In accordance with one or more aspects of the disclosure, a transistor device is provided, which includes a substrate structure with laterally disposed source, drain, and gate regions disposed above a semiconductor body, such as a III-Nitride material system. A first layer structure comprised of one or more layers of compound semiconductors comprising two or more elements from the group of Aluminum, Gallium, Indium and Nitrogen is disposed above the semiconductor body in the source, gate, and drain region. Typical compound semiconductor layer disposed above the semiconductor body include one or more layers of Aluminum Nitride (AlN), Aluminum Gallium Nitride (AlGaN), Indium Gallium Nitride (InGaN), or Gallium Nitride (GaN). The structure further includes a barrier material layer (BML) above the first layer structure. The BML consists of single or multi-layer compound semiconductors comprising two or more elements from the group of Aluminum, Gallium, Indium and Nitrogen. In certain embodiments, the BML comprises a compound including at least three of Aluminum, Gallium, Indium, and Nitrogen. Typical compound semiconductor layers used for the BML include Aluminum Gallium Nitride (AlGaN), Indium Aluminum Nitride (InAlN), Indium Aluminum Gallium Nitride (InAlGaN), and Aluminum Nitride (AlN). The BML can also be two or more compound semiconductor layers such as a 1 nm thick AlN spacer layer adjacent to the 2DEG or 2DHG and an InAlN layer. The presence of the AlN spacer layer adjacent to the two-dimension electron gas layer reduces alloy scattering and thus improves the carrier mobility compared to an InAlN barrier material alone. The InAlN material system can be advantageous for certain BML embodiments because an InAlN material with 17 percent indium concentration and 83 percent aluminum percentage will be lattice matched to GaN material layer. The BML can also comprise a GaN capping layer. The compound semiconductor layer or layers used for the BML in certain embodiments have a substantially uniform thickness in the source, drain and gate regions. The BML on the first semiconductor layer establishes the magnitude of the polarization induced two-dimensional electron gas (2DEG) or two-dimensional hole gas (2DHG) channel charge at the heterointerface between the BML and the first layer structure and is can facilitate establishing the device threshold voltage (Vth). An enhanced channel charge inducing material layer (ECCIML) is provided on or above the BML in the source and drain regions which includes one or more layers compound semiconductors comprising two or more elements from the group of Aluminum, Gallium, Indium and Nitrogen in certain embodiments. Exemplary compound semiconductor layers used for the ECCIML include without limitation Aluminum Nitride (AlN), Aluminum Gallium Nitride (AlGaN), and Indium Aluminum Nitride (InAlN). The ECCIML can also comprise a GaN capping layer. The enhanced channel charge induced by the ECCIML may advantageously act to reduce the source and drain access resistance. The ECCIML may also be doped with donors to achieve low N-type sheet resistance for N-channel Field Effect Transistors (FET) or doped with acceptors to achieve a low P-type sheet resistance for P-channel Field Effect Transistors to facilitate lowing the source and drain access resistance and contact resistance for some embodiments. The transistor also includes a gate above all or a portion of the gate region, with at least a portion of the gate extending down to and at least partially engaging the top surface of the BML in the gate region or in some embodiments, a portion of the gate can extend down to and at least partially engage the top surface of a thin GaN layer on the BML in the gate region. The transistor also includes a source electrode structure above a first portion of the ECCIML layer in the source region and a drain electrode structure above a second portion of the ECCIML in the drain region. The source and drain electrode structures electrically contact the two dimensional electron gas (2DEG) or two dimensional hole gas (2DHG) that is at a heterointerface between the BML and the first layer structure. One exemplary approach by which the source and drain electrode materials make electrical contact to the 2DEG or 2DHG include metal alloy spiking of the ohmic metal through the ECCIML and the BML, etching the ECCIML to facilitate electrical contact, and etching the ECCIML and the BML in the case that non-alloyed ohmic contact metal is used. The ECCIML layer and/or the BML may be provided with a capping layer such as Gallium Nitride (GaN) in certain embodiments, and the gate structure may include a gate dielectric material between a conductive gate structure and the BML. The device structure can include other dielectric layers that passivate the semiconductor surface, reducing current collapse, and reducing trapping. In various embodiments, moreover, a backside layer such as GaN or AlGaN may be provided below the channel to help increase the threshold voltage, to reduce the leakage current between source and drain, and to increase the breakdown voltage between the source and drain. In accordance with further aspects of the disclosure, a GaN BML capping layer is used along with an Indium Aluminum Nitride BML, a Indium Aluminum Gallium Nitride BML, or a Aluminum Gallium Nitride BML to provide enhanced etch selectivity and or improved surface passivation properties.

Further aspects of the disclosure provide a method for fabricating a transistor. The method includes forming a first layer structure (e.g., AlN, AlGaN, InGaN, InAlN, or GaN) above laterally extending source, drain and gate regions of a semiconductor body, and an AlGaN or InAlN BML and in certain embodiments a GaN BML capping layer is formed with a substantially uniform thickness. An AlN, AlGaN, or InAlN ECCIML is formed on the BML, and in certain embodiments, a GaN capping layer is formed on the ECCIML. The method further includes etching the ECCIML layer to expose the BML in at least a portion of the gate region with minimal altering of the thickness of the barrier material layer, after which gate, source, and drain structures are formed. A minimal altering of the thickness of the BML in certain embodiments is considered to be an etch process with reduces the thickness of the BML by a less than 0.7 nm. In another embodiment, the minimal BML thickness alteration is less than 10% of the original BML thickness. In another embodiment, the minimal BML thickness alteration is less than the equivalent of one monolayer of compound semiconductor thickness. In another embodiment, the minimal BML thickness alteration is less than 0.3 nm.

Various etch techniques can be used to etch the ECCIML with minimal altering the thickness of the BML. In certain embodiments using an AlN ECCIML over an AlGaN BML, an AZ-400K chemical etch process is used to remove the ECCIML layer and to expose the AlGaN BML with minimal altering of the thickness of the barrier material layer. The advantage of the use of AZ-400K chemical etch to remove the ECCIML layer is that the chemical can etch the AlN ECCIML but will have a very slow etch rate (high selectivity) for etching the AlGaN BML or GaN BML capping layer. In other embodiments, a GaN capping layer is formed on the ECCIML and a plasma etch process is used to remove at least a portion of the ECCIML before etching the ECCIML. The plasma etch process can be optimized to etch GaN at a higher etch rate than AlGaN. One advantage of the use of an GaN capping layer on the ECCIML is the GaN capping layer will minimize the lateral etch of the ECCIML in the case of poor adhesion of an etch protection layer such as silicon nitride on the surface of the ECCIML, and thus provide good lateral control of the ECCIML etch. A silicon nitride layer with poor adhesion can allow the chemical to extend lateral and without the presence of the GaN ECCIM capping layer would have poor lateral control of the ECCIML etch. Other embodiments utilize a digital etching process, including chemically or plasma oxidizing a thin layer of the ECCIML, stripping the oxidized ECCIML material, and repeating the oxidizing and stripping steps to expose the BML with minimal altering its thickness. Other embodiments utilize a plasma etch process for etching the ECCIML with minimal altering the thickness the BML. Since the ECCIML layer is thin (1 nm to 50 nm), a timed etch process such as a plasma or chemical etch process even with low selectivity for etching the ECCIML and stopping at the BML can be used without significant etching of the BML. The process in certain embodiments further includes forming a GaN capping layer either on the ECCIML or on the BML before forming the ECCIML layer and/or forming a backside layer above the semiconductor body in the gate region before forming the GaN layer. The GaN capping layer on the BML can serve as an etch stop layer and can have preferred surface properties for forming a Schottky barrier or a Metal Oxide Semiconductor (MOS) device structure.

In accordance with other aspects of the disclosure, a transistor fabrication method is provided, which includes forming one or more compound semiconductor layers comprising two or more elements from the group of Aluminum, Gallium, Indium and Nitrogen is disposed above a semiconductor body in the laterally extending source, drain and gate region, forming an AlGaN or InAlN BML including optional AlN spacer layer and GaN BML capping layer, with a substantially uniform thickness, and forming an AlN, AlGaN, or InAlN ECCIML on the BML. The ECCIML is oxidized to thin the ECCIML layer and to form Aluminum Oxide (e.g., $Al_2O_3$) above the BML with minimal altering its thickness of the BML, after which the gate, source, and drain structures are formed.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which.

DETAILED DESCRIPTION OF THE DISCLOSURE

Figure 1A:
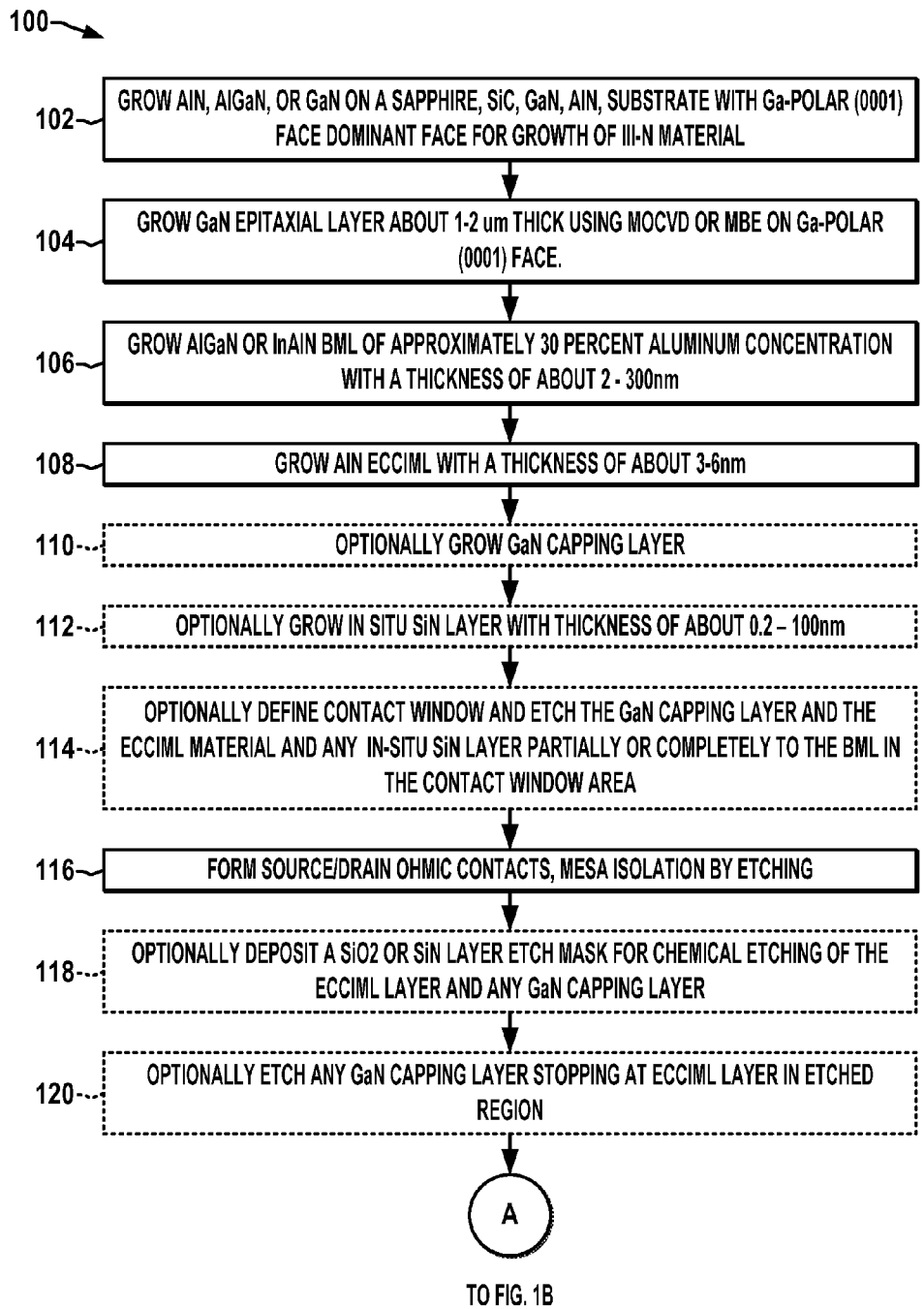
FIGS. 1A and 1B provide a flow diagram illustrating an exemplary process for fabricating a transistor in accordance with one or more aspects of the disclosure.

One or more embodiments or implementations are hereinafter described in conjunction with the drawings, where like reference numerals are used to refer to like elements throughout, and where the various features are not necessarily drawn to scale. The disclosure provides transistors and fabrication methods to facilitate precise, uniform, and repeatable FET threshold voltage control via control over the BML thickness, along with low source-drain access impedance through use of an enhanced channel charge inducing material layer (or layers) (ECCIML) in the source and drain access regions. The disclosure finds particular utility in connection with GaN, AlN, AlGaN, InGaN, InAlN, InAlGaN material systems having at least one heterojunction and either polar, semi-polar, or non-polar material, and the resulting transistors can be used for enhancement or depletion mode applications, including normally-off power switching devices with high mobility, enhancement mode transistors for enhancement-depletion mode logic, smart power integrated circuits combining power switches and enhancement-depletion mode logic, recess etched microwave transistors and microwave integrated circuits, and normally-on power switching transistors, and other applications.

Figure 1B:
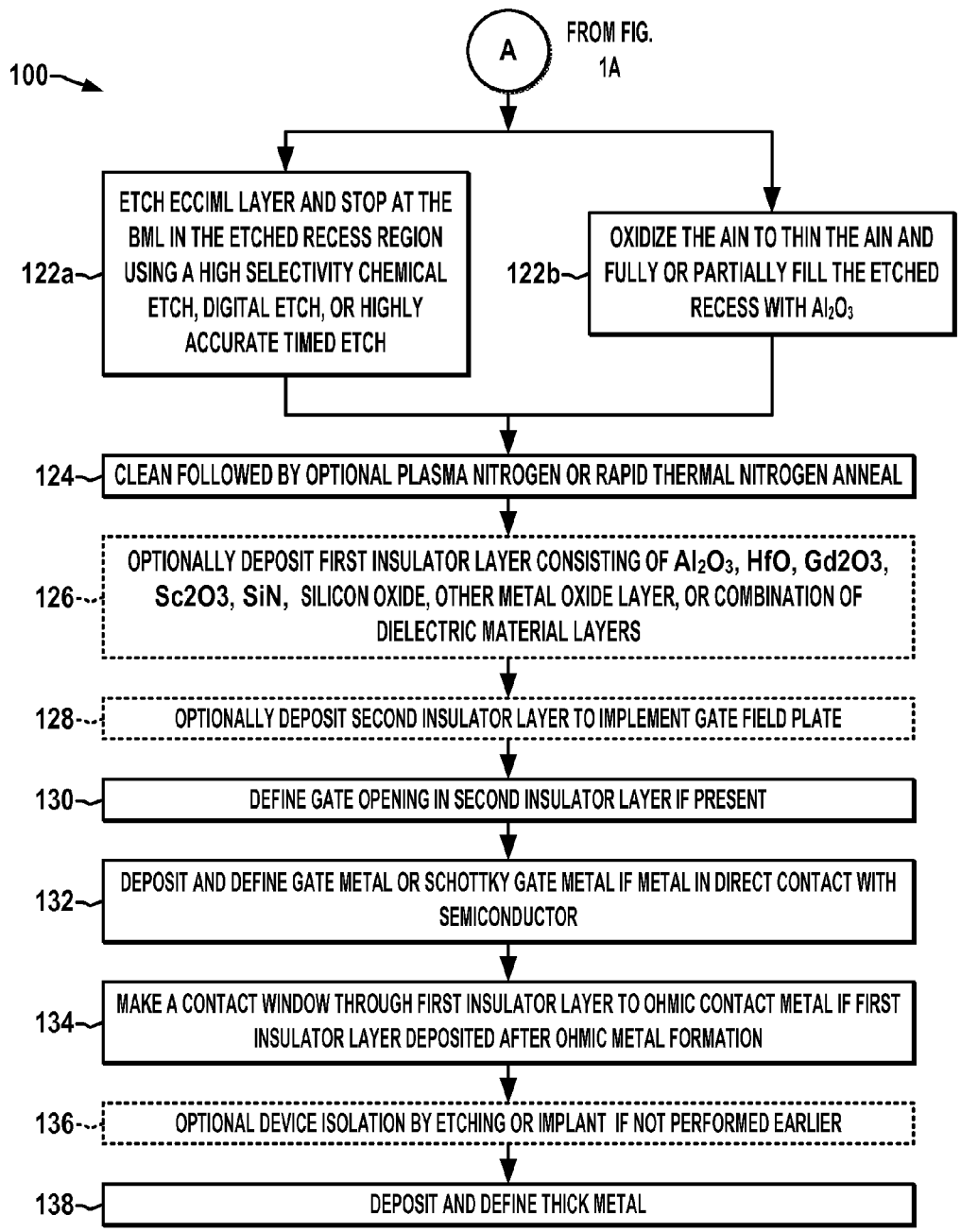

Referring initially to FIGS. 1A-2D, a process 100 is illustrated in FIGS. 1A and 1B for fabricating a transistor in accordance with one or more aspects of the 1A and 1B, and FIGS. 2A-2D depict an exemplary high electron mobility transistor 200 in accordance with various aspects of the disclosure. Although the exemplary process or method 100 and other methods of the disclosure are illustrated and described below as a series of acts or events, the present disclosure is not limited by the illustrated ordering of such acts or events. For example, some acts may occur in different orders and/or concurrently with other acts or events apart from those illustrated and/or described herein, and not all illustrated steps may be required to implement a methodology in accordance with the present disclosure. Moreover, the methods of the disclosure may be carried out in conjunction with various transistors and semiconductor devices described herein during manufacture, as well as in association with other devices not illustrated.

The various aspects of the disclosure are illustrated in FIGS. 1A-2D,5, and 6 for an exemplary field effect transistor employing epitaxial GaN, AlN, AlGaN, InGaN, InAlN, and/or InAlGaN material layers having at least one heterojunction and either polar, semi-polar, or non-polar material having either a gallium-face or nitrogen-face in certain embodiments. The exemplary transistor 200 in this case (best shown in FIG. 2D) includes a substrate structure with laterally disposed source, drain, and gate regions SR, DR, and GR, respectively, where the substrate structure includes a Silicon Carbide (SiC), Sapphire, Gallium Nitride, or Si semiconductor body 210 extending laterally throughout the regions SR, DR and GR, with a GaN layer 220 disposed above the semiconductor body 210. The transistor 200 in certain embodiments is a N-channel FET with electrical conduction of electrons in 2DEG, and in other embodiments, transistor 200 can be a P-channel FET with hole conduction in the 2DHG.

A barrier material layer (BML) 230 is situated above the GaN layer 220 in the regions SR, GR, and DR, where the BML 230 in certain embodiments is one or more compound layers individually including at least two of Aluminum, Gallium, Indium, and Nitrogen of any suitable stoichiometric ratios. In certain embodiments, moreover, the BML 230 is one or more compound layers individually including at least three of Aluminum, Gallium, Indium, and Nitrogen, such as AlGaN and/or InAlN of a substantially uniform thickness 230t throughout the regions SR, DR, and GR regions (e.g., the respective source, gate, and drain region BML thicknesses 230st, 230gt, and 230dt in FIG. 2D are generally equal, for instance, within 0.1 nm of one another. In certain embodiments, the barrier material layer comprises a compound including at least four of Aluminum, Gallium, Indium, and Nitrogen. In certain embodiments, the thicknesses 230st, 230gt, and 230dt are within 10% of one another. In certain embodiments, moreover, a heterointerface between the BML 230 and the first layer structure 220 forms a two dimensional electron or hole gas (2DEG or 2DHG). The BML 230 can be of any suitable thickness 230t, and some examples are up to around 50 nm thick. In certain embodiments, the BML 230 includes a GaN capping layer, for example, having a thickness of 0.5 nm or more and 10 nm or less, where the BML capping layer can be an etch stop layer. In certain embodiments, the BML 230 comprises a compound spacer layer adjacent to the 2DEG or 2DHG.

The device 200 in FIG. 2D also includes an enhanced channel charge inducing material layer (ECCIML) 240 formed on or over the BML 230 (or on any capping layer thereof) in the source SR region and the drain region DR, with the ECCIML being either removed from or oxidized in at least a portion of the gate region GR. The ECCIML 240 can be formed of any carrier enhancing material or materials, including without limitation one or more compound layers individually including at least two of Aluminum, Gallium, Indium, and Nitrogen, such as AlN, AlGaN, and InAlN of any suitable stoichiometric ratios in certain embodiments. The ECCIML 240 in certain embodiments is an AlN layer but can be an AlGaN or InAlN layer or combination of layers and can include a GaN capping layer(s) (242 in FIGS. 5 and 6) for reduction of lateral chemical etch of the ECCIML, improved surface properties, reduced current collapse, strain engineering, or for strain reduction. The material layers in the regions SR and DR thus include both the BML 230 and the ECCIML 240. The ECCIML 240 in certain embodiments has a different material composition than the BML 230 in that it will have a different percentage of elements or will be a different compound semiconductor.

A gate structure 276 is provided above all or a portion of the gate region GR, with at least a portion of the gate structure 276 extending downward to and at least partially engaging the top surface of the BML 230 in the gate region GR. A source structure 262, 272 including an ohmic structure 262 and a source contact 272 is disposed above at least a portion of the source region SR with a first portion of the ECCIML 240 extending under the source structure 262, 272 and above the BML 230 in the source region SR. A drain structure with ohmic structure 264 and conductive contact 274 is disposed above at least a portion of the drain region DR with at least a second portion of the ECCIML layer 240 extending under the drain structure 264, 274 and above the BML 230 in the region DR. A dielectric material 250, such as Silicon Nitride (SiN), is formed laterally between the gate 276, source 272, and drain 274.

In this device, for a gallium-polar material, typically grown on the Ga-polar (0001) face of GaN layer 220 with optional AlN nucleation layer or low temperature GaN nucleation layer at the interface between the semiconductor body substrate 210 and first layer 220, the BML 230 will induce a two-dimensional electron gas channel charge (2DEG) at the BML heterointerface between the BML 230 and the first layer 220 due to strain induced piezoelectric effect and/or the spontaneous polarization effect in the BML 230, where the threshold voltage Vth of the transistor 200 is controlled by the BML thickness 230t and aluminum concentration in the BML. The 2DEG when combined with N-type doped source and drain material and electrode structure and a control gate will implement an N-channel field effect transistor having electron conduction in the 2DEG. The material layer or layers in the first layer 220 will typically be N-type doped but one or more of the layers in 220 can be P-type doped for certain embodiments. In this device, for a nitrogen-polar material, typically grown on the nitrogen-polar (0001) face of GaN layer 220 with optional AlN nucleation layer or low temperature GaN nucleation layer at the interface between the substrate 210 and GaN first layer 220, the BML 230 will induce a two-dimensional hole gas (2DHG) channel charge at the BML heterointerface between the BML 230 and the first layer 220 due to strain induced piezoelectric effect and/or the spontaneous polarization effect in the BML 230, where the threshold voltage Vth of the transistor 200 is controlled by the BML thickness 230t and aluminum concentration in the BML. The 2DEG when combined with P-type doped source and drain material and electrode structures and a control gate will implement a P-channel field effect transistor having hole conduction in the 2DHG. The material layer or layers in the first layer 220 will typically be N-type doped but one or more of the layers in 220 can be P-type doped for certain embodiments. The polarization effects in the BML 230 are such that a GaN transistor fabricated on the Ga-polar (0001) face will be depletion mode with a negative threshold voltage Vth, where making the BML 230 sufficiently thin so that the effective polarization induced two-dimensional electron gas channel charge is reduced to effectively raise Vth to a positive voltage (normally-off voltage). In this regard, merely reducing the BML thickness 230t for Vth control would lead to high source-drain on-resistance (RDSON). Accordingly, the exemplary transistor 200 further provides an ECCIML 240 above the BML 230 in the source and drain regions SR and DR to lower the source and drain access resistances. The ECCIML 240 increases strain-induced piezoelectric and/or spontaneous polarization effects to enhance the two-dimensional electron gas channel charge in the heterointerface between BML 230 and GaN 220 beneath the ECCIML 240 in the source and drain access regions SR and DR.

The fabrication process 100 of FIGS. 1A-1B includes growing or otherwise forming an AlN, AlGaN, InGaN, or GaN layer on a sapphire, SiC, GaN, AlN substrate 110 in such a manner that the Ga-polar (0001) face is the dominant face for growth of III-N material. At 104, a first layer structure 220 is formed on the substrate, in one example, one or more layers of AlN, AlGaN, InGaN, or GaN epitaxial layer are grown to a thickness of approximately 1-2 um by MOCVD or MBE on the Ga-polar (0001) face above laterally extending source SR, drain DR and gate GR regions of the semiconductor body 210.

Figure 2A:
FIGS. 2A-2D are partial sectional side elevation views illustrating an exemplary high electron mobility transistor at various stages of manufacture in accordance with the disclosure.

At 106, a barrier material layer (BML) 230 is formed above the first (GaN) layer 220 with a substantially uniform thickness 230t throughout the source SR, drain DR and gate GR regions, as shown in FIG. 2A. The barrier material layer 230 includes AlGaN or InAlN and/or AlN spacer layer on the first layer structure in certain embodiments. In the embodiment of FIG. 2A, an AlGaN BML 230 is grown with approximately 27 percent aluminum concentration and a thickness 230t of 0.5 nm-50 nm. A 27 percent aluminum concentration is one exemplary concentration for an AlGaN BML 230 with approximately 25 nm thickness 230t to prevent excessive strain and cracking of the BML 230. The percent of aluminum concentration in the BML 230 can be increased higher than 27% for barrier layers thinner than 25 nm without excessive strain and cracking. In certain embodiments, the BML 230 has a substantially uniform thickness 230t of 10 nm or less and more typically 4 nm or less. In certain embodiments, the BML 230 has a substantially uniform thickness 230t of 0.5 nm or more and 50 nm or less. In this regard, a BML 230 with a thickness 230t less than approximately 4 nm for an AlGaN layer with approximately 27 percent aluminum concentration is used to achieve positive threshold voltage (normally-off operation). A BML thickness 230t of approximately 25 nm to 30 nm is used to fabricate a depletion mode microwave transistor or a normally-on power switching transistor. In certain embodiments (e.g., FIG. 6 below), the BML 230 comprises InAlN or InAlGaN with a Gallium Nitride GaN capping layer 232 with the Gallium Nitride capping layer functioning as an etch stop layer and a layer with improved surface properties. In certain embodiments, the BML 230 includes an AlN spacer layer adjacent to the 2DEG or 2DHG.

Figure 2B:
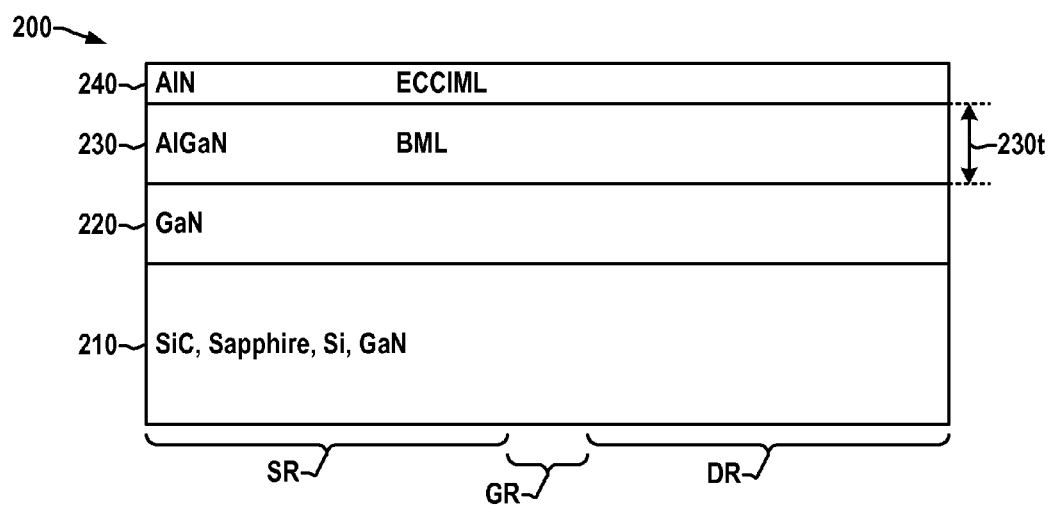

At 108, an enhanced channel charge inducing material layer (ECCIML) 240 is formed on the BML 230 in the regions SR, GR, and DR, as shown in FIG. 2B. In one example, an AlN ECCIML 240 is grown at 108 to a thickness of approximately 3-6 nm. In other embodiments, the ECCIML layer 240 can be AlN, AlGaN and/or InAlN of any suitable thickness to induce a high density of two-dimensional electron gas at the heterointerface between the BML 230 and the first layer structure 220. In certain embodiments, the ECCIML layer 240 has a thickness of 10 nm or less and in other embodiments, the ECCIML layer 240 has a thickness of 50 nm or less. At 110 in FIG. 1A, an optional GaN capping layer can be grown on the ECCIML 240 (e.g., ECCIML capping layer 242 in FIGS. 5 and 6), and an in-situ silicon nitride layer (e.g., range of thickness of 0.2 nm to 100 nm) can optionally be grown at 112. At 114, a contact window can be optionally defined and the GaN capping layer 242 and the ECCIML material 240 are partially or completely etched to the BML 230 in the contact window area. If an in-situ SiN layer is present, the in-situ SiN is also etched at 114.

Source and drain ohmic contacts are formed including a photolithography step and metal liftoff with anneal and mesa isolation etching is performed at 116. The anneal in certain embodiments will cause the ohmic metal to spike through the ECCIML and BML layers making electrical contact to the two dimensional electron gas at the heterointerface between the BML 230 and the first layer structure 220. The device isolation at 116 can be performed by mesa etch, or other alternate methods of forming the device isolation can be used such as ion implantation later in the process.

At 118, a silicon oxide or silicon nitride layer can optionally be deposited for use as an etch mask for chemical etching of the ECCIML 240 and any GaN capping layer 242 is optionally etched at 120 if present. The silicon oxide or silicon nitride layer can optionally be used as the second insulator layer to facilitate the implementation of a gate field plate process.

Figure 2C:
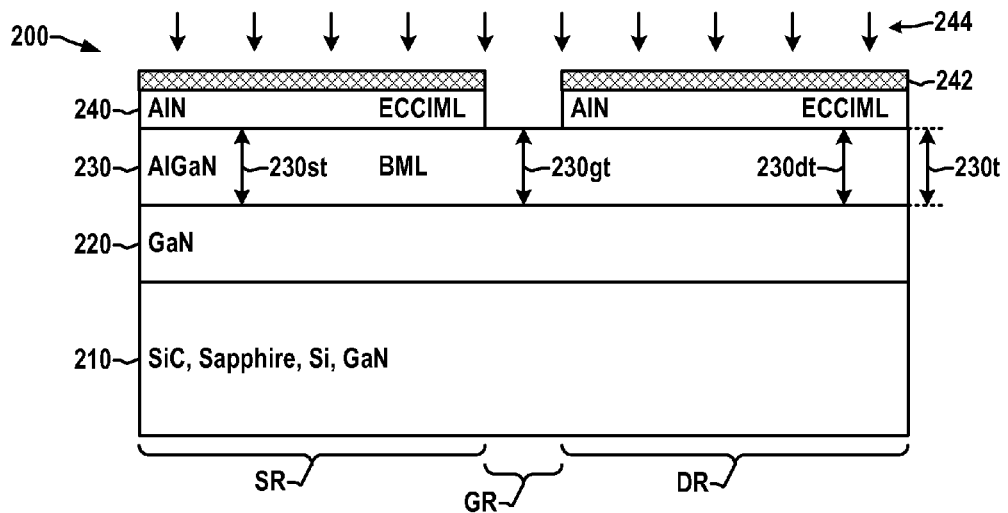
Figure 2D:
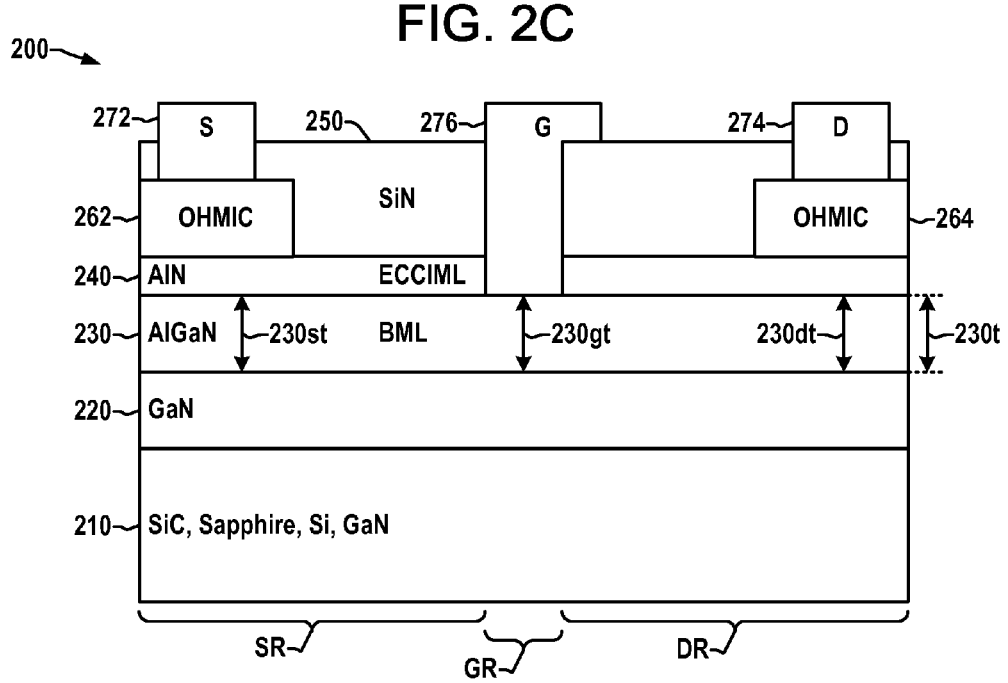

As shown in FIGS. 1B and 2C, various techniques can be used to etch the ECCIML 240 at 122a or an oxidation process can be used at 122b to expose the BML 230 in at least a portion of the gate region GR with minimal altering of the BML thickness 230t. For example, the minimal altering of the BML thickness 230t in certain embodiments reduces the thickness 230t by less than 0.7 nm. In certain embodiments, moreover the minimal BML thickness alteration reduces the thickness of the barrier material layer BML by less than 10% of its original thickness. In this regard, the thickness alteration is preferably only in all or a portion of the gate region GR.

In certain embodiments using an AlN ECCIML 240 over an AlGaN BML 230, an AZ-400K chemical etch process or variant of AZ-400K chemical etch process is used at 122a to remove the ECCIML layer 240 and to expose the AlGaN BML 230 with minimal altering of the BML thickness 230t. In certain embodiments, the chemical etch process uses a KOH-based chemical etch process. In certain embodiments, the chemical etch process uses a chemical etch that has a higher etch rate for etching the ECCIML 240 than for etching the BML 230. In certain embodiments, the ECCIML 240 is etched using a plasma etch process, for example, where the plasma etch process uses chlorine/argon chemistry, oxygen/chlorine/argon chemistry, chorine/bromine/argon chemistry, or oxygen/chlorine/bromine/argon chemistry. In certain embodiments, the chemical etch process uses a chemical etch that has a higher etch rate for etching the ECCIML 240 than for etching a GaN capping layer on the BML 230, for example, GaN capping layer on the BML 230 functions as an etch stop layer for the etch that is etching the ECCIML 240.

In other embodiments, a GaN capping layer 242 is formed on the ECCIML 240 and a plasma etch process using chlorine/argon chemistry, oxygen/chlorine/argon chemistry, chlorine/bromine argon chemistry, oxygen chlorine/bromine/argon chemistry or silicon chloride/silicon fluoride/argon chemistry is used at 122a to expose at least a portion of the ECCIML 240 before etching the ECCIML 240. The plasma etch process for etching the GaN capping layer 242 may have a higher etch rate for GaN capping layer 242 than for the ECCIML 240 layer Other embodiments utilize a digital etching process at 122a, including oxidizing a thin layer of the ECCIML 240, stripping the oxidized ECCIML material, and repeating the oxidizing and stripping steps to expose the BML 230 without altering its thickness 230t. In certain embodiments, the ECCIML layer is stripped using a plasma etch process. In other possible implementations, a carefully controlled timed etch process can by used at 122a. In certain embodiments, the ECCIML 240 is etched at 122a in FIG. 1B entirely to the BML 230 and the BML 230 is substantially or entirely unetched because of a high etch selectivity of the ECCIML 240 to the BML 230 (in this case, the BML 230 acts as an etch stop for the ECCIML etch at 122a).

Alternatively or in combination, the ECCIML 240 (and any capping layer 242) can be removed under the gate portion of the gate region GR at 122b by oxidizing the ECCIML layer 240 to thin the ECCIML layer 240 and to form Aluminum Oxide $Al_2O_3$ above the barrier material layer 230 in at least a portion of the gate region GR without altering the thickness of the barrier material layer 230. In such embodiments, the gate structure will contact the oxide material instead of the underlying BML 230.

Thereafter, any suitable processing techniques and steps can be used to form a gate structure 276 (with or without gate dielectric material 680 (FIG. 7) above at least a portion of the gate region GR with at least a portion of the gate structure 276 extending downward to and at least partially engaging a top surface of the barrier material layer 230 or any oxidized ECCIML 240 in the gate GR region. Moreover, a source structure 262, 272 and a drain structure 264, 274 are formed above first and second portions of the ECCIML layer 240 in the region SR and DR, respectively.

In the illustrated process 100, a clean operation is performed at 124 followed by an optional plasma nitrogen or rapid thermal nitrogen anneal (RTA), and a first insulator layer (e.g., $Al_2O_3$, $HfO_2$, $Gd_2O_3$, $Sc_2O_3$, MgO, insitu silicon nitride, deposited Silicon Nitride, Silicon Oxide, other metal oxide layer or combination of dielectric material layers) can be optionally deposited at 126. The first insulator layer (gate insulator layer) can be optimized for the capability to have a low surface state density, low hot electron carrier trapping, low pin hole density, and high dielectric field strength. An optional anneal at approximately 200-600 degrees C. can be performed to increase the dielectric strength of the ex-situ deposited first insulator layer if the first insulator material is deposited using atomic layer deposition (ALD).

At 128, a second insulator (e.g., one or more dielectric layers) can optionally be deposited for gate field plate implementation. The second insulator material layer can be defined to reside above the ECCIML surface, optionally self-aligned to the edge of the etch recess region, to be used to optimize the electric field reduction that is made possible by using the gate material layer 276 that overlaps the second insulator material layer. The properties of the second insulator material can advantageously be tuned for passivation the semiconductor surface, reducing current collapse, reducing carrier trapping in responsible for lag in device response, reducing hot carrier trapping, and other issues important for device reliability.

A photolithography step is used at 130 to define the gate opening in the second insulator layer if present, and gate material (e.g., Schottky gate metal if metal in direct contact with semiconductor) is deposited and defined at 132, which can overlap the edges of the etched recess opening or alternately can be inside the edges of the gate opening. At 134, a photolithography step is performed to make a contact window through the first insulator layer to ohmic contact metal if first insulator layer is deposited after ohmic metal formation, and optional device isolation can be done at 136 by etching or implant (if not performed at an earlier step) before the thick contact metal is deposited and defined at 138 to yield the transistor 200 of FIG. 2D.

Figure 3:
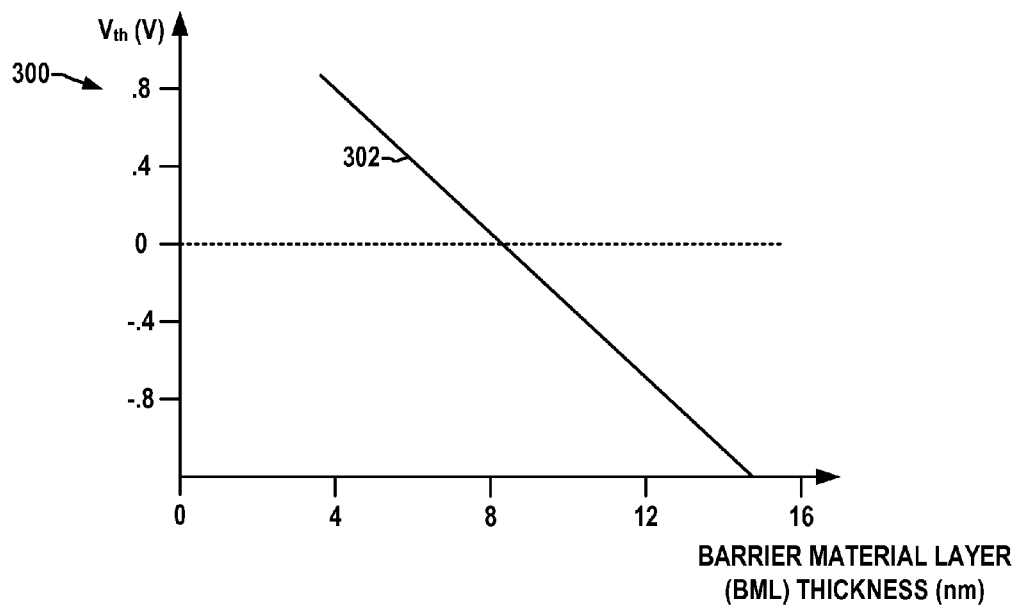
FIG. 3 is a graph illustrating a threshold voltage curve as a function of BML thickness.
Figure 4:
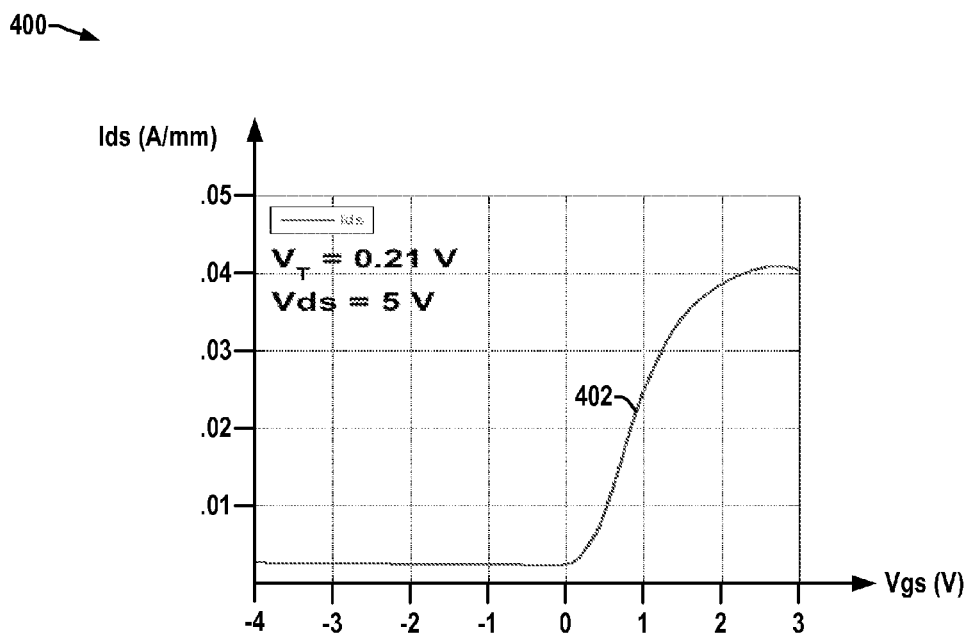
FIG. 4 is a graph illustrating an exemplary curve showing current vs. voltage curve of an HEMT device.
Figure 5:
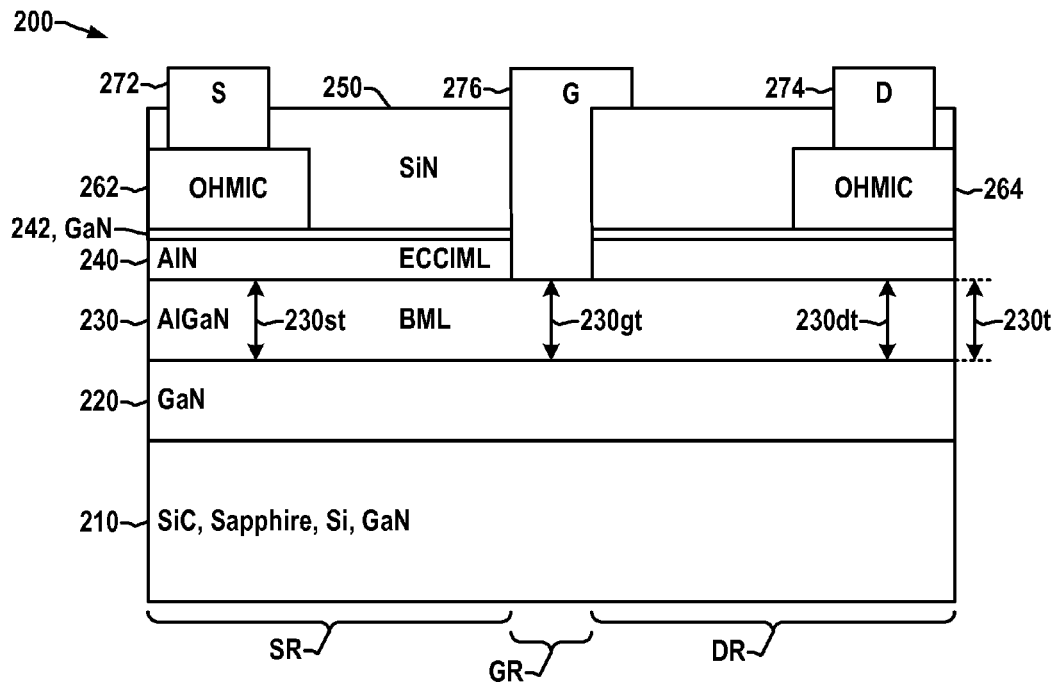
FIG. 5 is a partial sectional side elevation view illustrating another exemplary HEMT device including an ECCIML capping layer in accordance with the disclosure.
Figure 6:
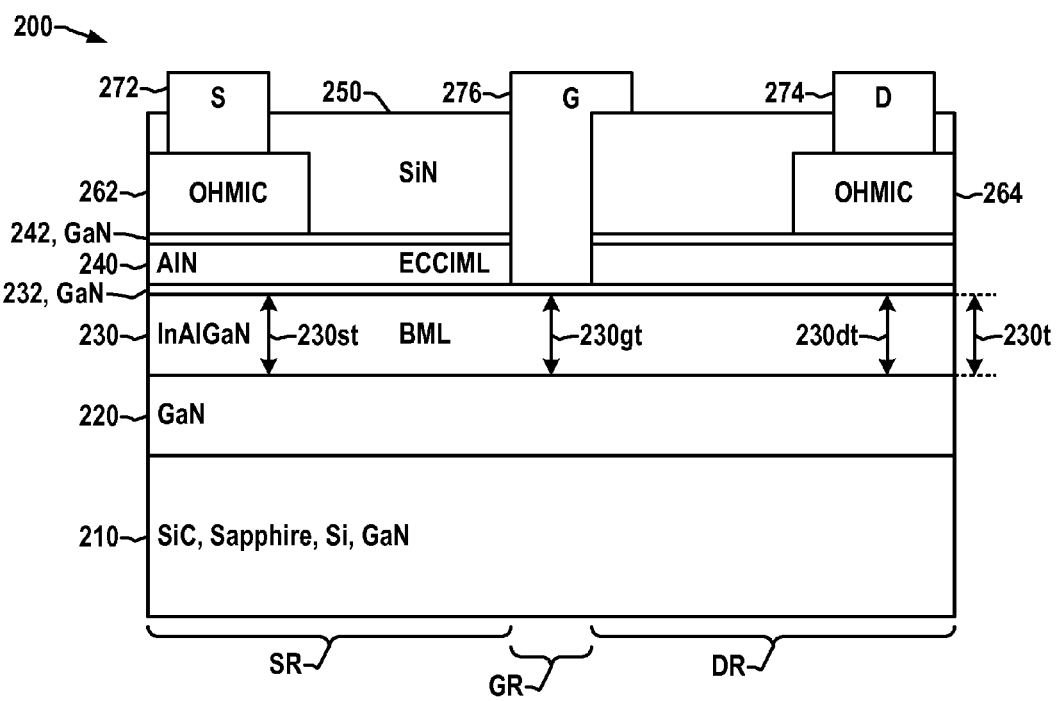
FIG. 6 is a partial sectional side elevation view illustrating another exemplary HEMT device including ECCIML and BML capping layers in accordance with the disclosure.

Referring also to FIGS. 3 and 4, a GaN/AlGaN HEMT 200 as shown in FIG. 2D with an ultra thin (4 nm) AlGaN BML 230 on a GaN first layer structure 220 can achieve a positive threshold voltage (normally-off operation) and the thin AlN ECCIML 240 in the source and drain access regions SR, DR lowers the source and drain resistances (e.g., RDSON). One implementation demonstrated a mobility of 700 V/cm-s and a positive threshold voltage of 0.21V (normally-off operation). In this example, a chemical etch stop approach that etches the ECCIML 240 and stops at the BML 230 was used to implement the etched recess region for a recessed-gate HEMT, where the threshold voltage Vth shifts linearly with AlGaN BML thickness 230t for a GaN/AlGaN HEMT fabricated on Ga-polar (0001) face material (FIG. 2D). This is exemplified in the graph 300 of FIG. 3 illustrating a threshold voltage curve 302 as a function of BML thickness 230t. Graph 400 in FIG. 4 shows an I-V curve 402 of the enhancement mode HEMT 200.

In other variant implementations, KOH-based etches can be controlled to selectively etch AlN ECCIML 240 and stop at an AlGaN BML 230 (with the AlGaN BML having approximately a 30 percent aluminum concentration). Using heated AZ400K developer, it is possible to etch away 4 nm thick AlN ECCIML 240 in 20 minutes and not etch the AlGaN BML 230 even after an additional hour. Transistor structures 200 are thus believed to be possible with 8 nm and 2 nm thick AlGaN BML 230, with threshold voltages of −0.48V and 0.21V, respectively. More advanced transistor structures 200 are thus believe to be possible with AlGaN BML or AlN BML with layer thickness as small as 0.5 nm with an even higher threshold voltage.

Figure 7:
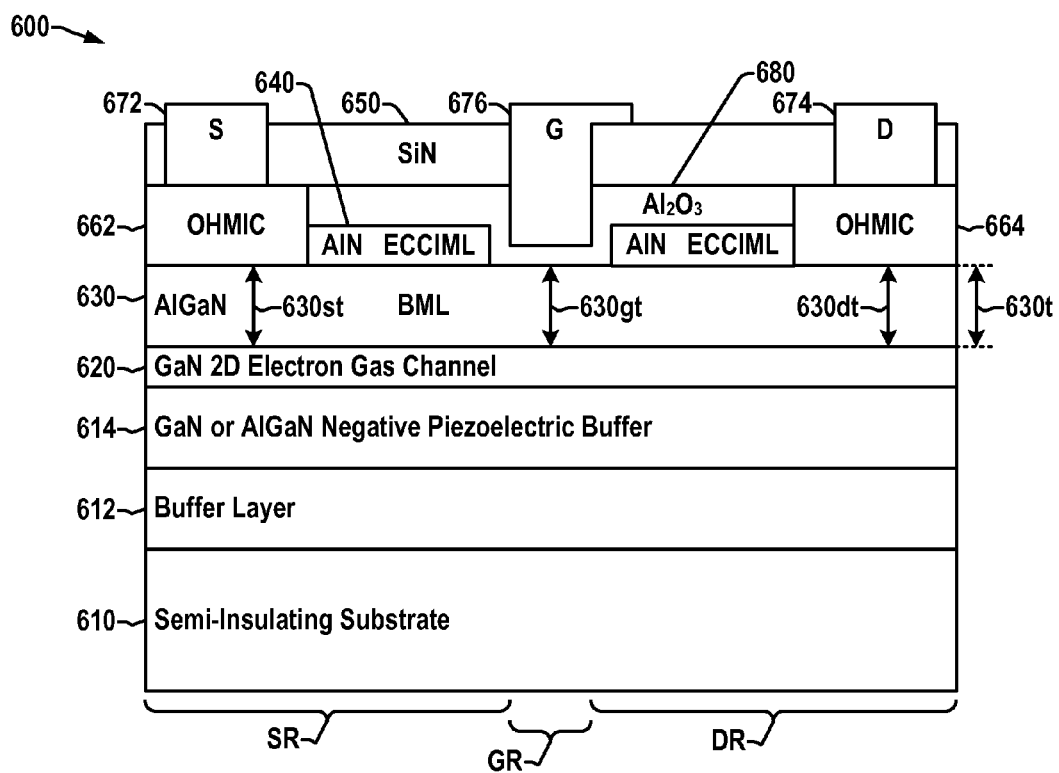
FIG. 7 is a partial sectional side elevation view illustrating another exemplary HEMT device including a gate dielectric material and a backside GaN or AlGaN back barrier layer beneath the channel in accordance with the disclosure.

Referring also to FIG. 7, an alternate implementation 600 is shown including a semiconductor body 610 extending laterally throughout the source, drain and gate regions SR, DR, and GR, with a first layer structure 620 comprising a buffer layer 612 and a GaN or AlGaN backside back barrier layer 614 between the semiconductor body 610 and a first layer structure 620 (GaN in this example, alternatives include AlN, AlGaN as above). A BML 630 is provided above the first layer structure 620 comprising AlGaN or InAlGaN of a substantially uniform thickness 630t throughout the source, drain and gate regions (with or without a BML cap layer as discussed above). An ECCIML 640 is provided over the BML 630 in at least portions of the source and drain regions SR, DR and formed of AlN, AlGaN, and/or InAlN, with source and drain ohmic structures 662 and 664 extending to the BML 630 in certain embodiments. An anneal will typically cause a portion of the ohmic metal structure 662 and 664 to spike through the ECCIML and BML layers making electrical contact to the two dimensional electron gas at the heterointerface between the BML 630 and the first layer structure 620. Upper source and drain thick metal contact structures 672, 674 contact the ohmic structures 662, 664, respectively with a gate dielectric material 680 ($Al_2O_3$ in one example) disposed between a gate contact 676 and the BML 630 in the gate region GR, with a SiN insulator laterally separating the gate 676, source 672, and drain 674. Other dielectric layers could be used, such as SiN, $SiO_2$, $Al_2O_3$, or $HfO_2$ either before or after AlN ECCIML etched recess region opening and gate metal deposition. The former case is desirable to lower the gate-to-semiconductor leakage current as the gate is driven to higher positive bias, while the latter case is desirable to passivate the surface, reduce current collapse, reduce hot carrier trapping, reduce transistor response lag, and reduce surface state density. In the embodiment of FIG. 7, moreover, the backside GaN or AlGaN material layer 614 between the first layer structure GaN channel layer 620 and the substrate 610 increases the threshold voltage of the transistor 600, reduces the effective thickness of the gate region to provide improved carrier confinement for improve transistor linearity, reduces the leakage current from source to drain under high Vds bias, and increases the blocking voltage. The 2DEG or 2DHG is located at the heterointerface of the BML 630 and the GaN cannel layer 620. The GaN channel layer 620 in certain embodiments can range in thickness from 5 nm to 1 um and the backside AlGaN material layer 614 can range in thickness from approximately 5 nm to 2 um. The use of the backside AlGaN layer 614 is especially important for power switching device to increase the threshold voltage to aid in achieving normally-off operation and secondly, in reducing source to drain leakage current at high blocking voltage operation. The backside AlGaN layer 614 can be a negative piezoelectric buffer layer by compensating for the piezoelectric induce polarization that is induced by the barrier material layer 630.

In certain embodiments a GaN capping layer (e.g., capping layer 242 in FIGS. 5 and 6 above) can be grown on top of the AlN ECCIML layer 640 to reduce the strain in the composite GaN/AlN ECCIML layer 640, to mitigate cracking in the AlN material 640, as well as to improve the surface stability, reduce current collapse, and to reduce the lateral chemical etch of the ECCIML 640.

A further variation is to use a wet or dry etch to remove the AlN ECCIML 240, 640 in the contact region for ohmic contact before ohmic metal deposition. The removal of the AlN ECCIML layer 240, 640 in the contact window area is expected to lower gate contact resistance since the AlN ECCIML material 240, 640 provides a relatively high energy barrier that might otherwise impede ohmic contact formation.

Also, as shown in the embodiment of FIG. 7, a thin insulator or gate dielectric material layer (e.g., $Al_2O_3$ 680) may be provided between the conductive gate material 676 and the semiconductor material, which is particularly useful in FET devices 200, 600 made with an ultra thin BML 630 to reduce the gate to semiconductor leakage current under bias and also to facilitate application of a higher positive gate voltage than is the case if a metal Schottky gate 676 is used. In this regard, a thin insulator with a built-in fixed negative charge, such as $Al_2O_3$ 680 for instance, helps to increase Vth for creation of normally-off devices 600.

In the embodiment of FIG. 7, moreover, the lateral edges of the gate structure 676 are inside of the lateral edges of the etched recess region with a selected distance between the edge of the gate 676 and the edge of the etched recess region on the source side of the gate and a selected distance between the edge of the gate 676 and the edge of the etched recess region on the drain side of the gate 676. This approach is advantageous for a normally-on microwave field effect transistor 600 or for a normally-on power switch transistor that uses a BML 630 that induces significant carrier density in a two-dimensional electron gas layer. The carrier density in the two-dimensional gas channel in the region between the edge of the ECCIML 640 and the edge of the gate 676 will be determined by the strain-induced polarization effect and spontaneous polarization effect of the BML 630. A BML 630 with adequate strain-induced polarization effect and spontaneously polarization effects facilitates maintaining low overall source and drain access resistance, where using an ECCIML 640 in a large percentage of the gate and drain access regions facilitates lowering the source and drain access resistance. In certain implementations, a larger distance is provided between the edge of the etched recess region and the edge of the gate on the drain side than on the source side to allow application of high drain voltages without reaching the critical electric field for breakdown.

As previously mentioned, the gate structure 676 can be designed in other embodiments to overlap beyond the edge of the etched recess region of the ECCIML 640 (on both the source side and drain side of the etched recess region), for instance, by coating the top surface of the ECCIML 640 with a thin gate oxide insulator layer (e.g., the first insulator layer at 126 in FIG. 1B above), or on to a second insulator layer (e.g., 128 in FIG. 1B) or a combination of these two insulators, with the gate 676 overlapping the insulator material above the ECCIML 640 in such a manner to form a gate-field-plate. An advantage of such embodiments is that a high carrier density can be maintained in the two-dimensional electron gas channel in the source and drain access regions to very close lateral distance to the two-dimensional electron gas channel beneath the gate 676.

As noted above in connection with FIGS. 1A-2D, the exemplary FET 200 is fabricated in the GaN, AlN, AlGaN, InGaN, InAlN, InAlGaN III-N (III-nitride) material system with the GaN/AlGaN/AlN/InGaN/InAlN, InAlGaN layers grown epitaxially, typically by MOCVD or MBE. These materials can in certain embodiments be grown so that the Ga-polar (0001) face is the controlling face for epitaxial growth. The device structure can also be implemented on semi-polar GaN substrates, GaN on a sapphire substrate, GaN on SiC substrates, and GaN on silicon substrates, for example. When the material is grown so that the Ga polar (0001) face is the controlling face, spontaneous and piezo-electric polarization effects in the BML 230 and the ECCIML 240 induce a carrier density of two-dimensional electron gas at the heterointerface of the BML 230 and the first layer structure 220 forming the FET channel layer. The AlN/GaN and AlGaN layers for a GaN FET will typically be grown on a SiC substrate, a GaN substrate, sapphire substrate, an AlN substrate, or an AlGaN substrate. An AlN nucleation layer can be used for growth on a sapphire and SiC substrate. Beginning with a Ga-polar (0001) face material, the process sequence then continues to grow approximately one to two microns of GaN material followed by the growth of the BML 230 followed by growth of the ECCIML 240.

There are a number of options in growing the III-N material 220 beneath the two-dimensional electron gas channel layer, such as incorporating a thin GaN or InGaN channel layer, incorporating an AlGaN or InGaN back barrier material 614 (FIG. 7), utilizing a P-type GaN material layer (to achieve normally-off operation and reduce the leakage current at high blocking voltage), or to utilize a delta doped silicon layer in combination with the P-type GaN material layer to lower the threshold voltage Vth. The BML 230 is typically implemented using an AlGaN material layer or an InAlN material layer and can range in thickness from approximately 0.5 nm to 50 nm in certain embodiments. A BML GaN capping layer 232 can range in thickness from 0.5 nm to approximately 10 nm in certain embodiments. The ECCIML 240 is typically implemented as an AlN layer, an AlGaN material layer, or an InAlN material. For an AlN ECCIML material layer 240, the AlN thickness will typically be less than 10 nm, such as approximately 2 nm to 6 nm in certain embodiments. The ECCIML 240 has a different material composition than the BML 230 in certain embodiments, and will have a different percentage of elements or will be a different compound semiconductor. An optional GaN cap layer 242 can be grown on the surface of the AlN ECCIML layer 240 for reduction of lateral chemical etch of the ECCIML and to help reduce the overall strain in the AlGaN/AlN/GaN composite material structure to prevent cracking of the AlGaN/AlN material layer. The GaN capping layer 242 can also provide a III-N surface with enhanced stability and can help to minimize or eliminate current collapse in GaN devices 200.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A transistor, comprising:
 a substrate structure with laterally disposed source, drain, and gate regions, the substrate structure comprising;
 a semiconductor body extending laterally throughout the source, drain and gate regions,
 a first layer structure comprising a compound including at least two of Aluminum, Gallium, Indium, and Nitrogen disposed above the semiconductor body in the source, drain and gate regions,
 a barrier material layer disposed above the first layer structure in the source, drain and gate regions, the barrier material layer comprising a compound including at least two of Aluminum, Gallium, Indium, and Nitrogen and having a substantially uniform thickness throughout the source, drain and gate regions, with a heterointerface between the barrier material layer and the first layer structure forming a two dimensional electron or hole gas (2DEG or 2DHG), the barrier material layer additionally comprising a Gallium Nitride capping layer and
 an enhanced channel charge inducing material layer (ECCIML) formed above the barrier material layer in the source region and the drain region, the ECCIML layer comprising a compound including at least two of Aluminum, Gallium, Indium, and Nitrogen;
 a gate structure disposed above at least a portion of the gate region, at least a portion of the gate structure extending downward to and at least partially engaging a top surface of the barrier material layer in the gate region;
 a source structure electrode formed in source region in contact with the 2DEG or 2DHG; and
 a drain structure electrode formed in drain region in contact with the 2DEG or 2DHG.

2. The transistor of claim 1, where the first layer structure comprises at least one of Aluminum Nitride, Aluminum Gallium Nitride, Indium Gallium Nitride, Indium Aluminum Nitride, and Gallium Nitride.

3. The transistor of claim 1, where the first layer structure is a multi-layer structure with at least two layers individually comprising a compound including at least two of Aluminum, Gallium, Indium, and Nitrogen.

4. The transistor of claim 1, where the barrier material layer comprises a compound including at least three of Aluminum, Gallium, Indium, and Nitrogen.

5. The transistor of claim 1, where the barrier material layer comprises at least one of Aluminum Gallium Nitride, Indium Aluminum Nitride, and Aluminum Nitride.

6. The transistor of claim 1, where the ECCIML layer comprises at least one of Aluminum Nitride, Aluminum Gallium Nitride, and Indium Aluminum Nitride.

7. The transistor of claim 1, where the ECCIML layer comprises a Gallium Nitride capping layer.

8. The transistor of claim 1, where the Gallium Nitride capping layer has a thickness of more than 0.5 nm but less than 10 nm.

9. The transistor of claim 1, where the Gallium Nitride capping layer is an etch stop layer.

10. The transistor of claim 1, where the barrier material layer comprises a compound spacer layer adjacent to the 2DEG or 2DHG.

11. The transistor of claim 1, where the gate structure comprises:
 a gate dielectric material extending downward to and at least partially engaging the top surface of the barrier material layer in the gate region; and
 a gate conductor structure disposed above the gate dielectric material.

12. The transistor of claim 1, where the substrate structure further comprises a backside layer in the gate region between the semiconductor body and the 2DEG or 2DHG.

13. The transistor of claim 1, where the substrate structure further comprises a backside layer in the gate region between the semiconductor body and the first layer structure.

14. The transistor of claim 1, where the transistor is an N-channel field effect transistor having electron electrical conduction in the 2DEG.

15. The transistor of claim 1, where the transistor is a P-channel field effect transistor having hole electrical conduction in the 2DHG.

16. The transistor of claim 1, where the barrier material layer is Aluminum Gallium Nitride having a substantially uniform thickness throughout the source, drain and gate regions, and where the ECCIML layer is Aluminum Nitride.

17. The transistor of claim 16, where the barrier material layer has a substantially uniform thickness of 0.5-nm or more and 50 nm or less.

18. The transistor of claim 16, where the barrier material layer has a substantially uniform thickness of 10 nm or less.

19. The transistor of claim 18, where the ECCIML layer has a thickness of 50 nm or less.

20. The transistor of claim 18, where the ECCIML layer has a thickness of 10 nm or less.

21. The transistor of claim 1, where the ECCIML is etched to the barrier material layer with minimal altering of the thickness of the BML.

22. The transistor of claim 21, where the minimal altering of the thickness of the barrier material layer reduces the thickness of the barrier material layer by less than 0.7 nm.

23. The transistor of claim 21, where the minimal altering of the thickness of the barrier material layer reduces the thickness of the barrier material layer by less than 0.3 nm.

24. The transistor of claim 21, where the minimal altering of the thickness of the barrier material layer reduces the thickness of the barrier material layer by less than 10% of its original thickness.

25. The transistor of claim 21, where the minimal altering of the thickness of the barrier material layer reduces the thickness of the barrier material layer by less than an equivalent thickness of one monolayer.

* * * * *